(12) United States Patent
Hsu (10) Patent No.: US 8,054,639 B2
(45) Date of Patent: Nov. 8, 2011

(54) IMAGE-SENSING MODULE FOR REDUCING OVERALL THICKNESS THEREOF AND PREVENTING EMI

(75) Inventor: Chi-Hsing Hsu, Taipei (TW)

(73) Assignee: Azurewave Technologies, Inc., Taipei (TW)

( * ) Notice: Subject to any disclaimer, the term of this patent is extended or adjusted under 35 U.S.C. 154(b) by 493 days.

(21) Appl. No.: 12/292,906

(22) Filed: Dec. 1, 2008

(65) Prior Publication Data
US 2010/0134985 A1 Jun. 3, 2010

(51) Int. Cl.
*H05K 1/00* (2006.01)

(52) U.S. Cl. ........ 361/749; 361/753; 361/816; 361/818; 174/254

(58) Field of Classification Search .................. 361/749, 361/753, 816, 818; 174/254
See application file for complete search history.

(56) References Cited

U.S. PATENT DOCUMENTS

| 7,350,326 B2 * | 4/2008 | Hu | 40/544 |
| 2007/0066099 A1 * | 3/2007 | Li | 439/80 |

* cited by examiner

*Primary Examiner* — Tuan T Dinh
*Assistant Examiner* — Hung Dang
(74) *Attorney, Agent, or Firm* — Rosenberg, Klein & Lee (57) ABSTRACT

An image-sensing module for reducing its overall thickness and preventing electromagnetic interference (EMI) includes a flexible substrate, an image sensor, and a plurality of electronic elements. The flexible substrate has a first PCB (Printed Circuit Board), a flexible bending board bent upwards from one side of the first PCB, and a second PCB extending forwards from the flexible bending board and disposed above the first PCB. The second PCB has at least one first opening. The image sensor is electrically disposed on the first PCB, and the image sensor is exposed by the first opening of the second PCB. The electronic elements are selectively electrically disposed on the first PCB and/or on the second PCB so that the electronic elements are disposed between the first PCB and the second PCB.

15 Claims, 7 Drawing Sheets

IMAGE-SENSING MODULE FOR REDUCING OVERALL THICKNESS THEREOF AND PREVENTING EMI

BACKGROUND OF THE INVENTION

1. Field of the Invention

The present invention relates to an image-sensing module, and particularly relates to an image-sensing module for reducing its overall thickness and preventing electromagnetic interference (EMI).

2. Description of Related Art

The advantage of CMOS (Complementary Metal-Oxide-Semiconductor) is low power consumption and small size, so that the CMOS image-sensing chip package module can integrate into portable electronic device with small size such as mobile phone and notebook.

Referring to FIGS. 1A to 1D, the prior art provides an image-sensing module, including: a hard substrate 1, an image sensor 2, a plurality of electronic elements 3, an anti-EMI (Electromagnetic Interference) element 4, and a USB connector 5. The image sensor 2 and the electronic elements 3 are electrically disposed on the hard substrate 1. The image sensor 2 is exposed by the first opening 40 of the anti-EMI element 4, and the hard substrate 1 and the electronic elements 3 are encircled by the anti-EMI element 4. Hence, the thickness h1 of the hard substrate 1 and the thickness h2 of the anti-EMI element 4 cannot be reduced, so the overall thickness of the image-sensing module of the prior art cannot be reduced.

Figure 1A:
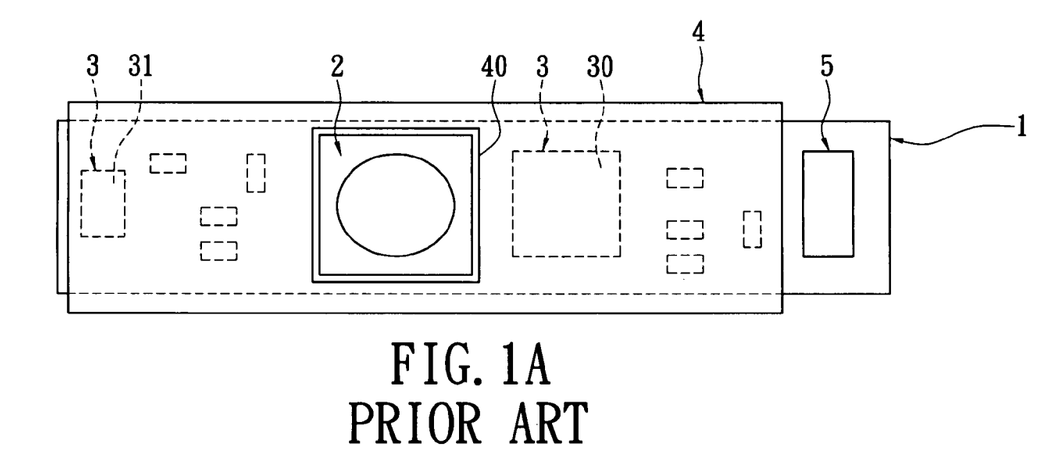
FIG. 1A is a top, schematic view of an image-sensing module of the prior art.
Figure 1B:
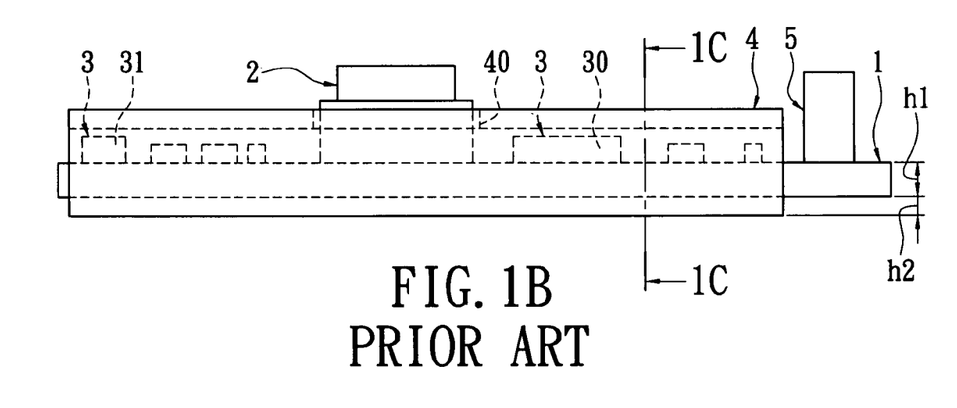
FIG. 1B is a front, schematic view of the image-sensing module of the prior art.
Figure 1C:
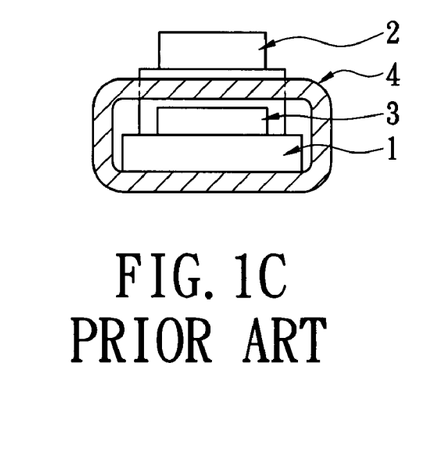
FIG. 1C is a cross-sectional, schematic view along line 1C-1C of the image-sensing module shown in FIG. 1B.
Figure 1D:
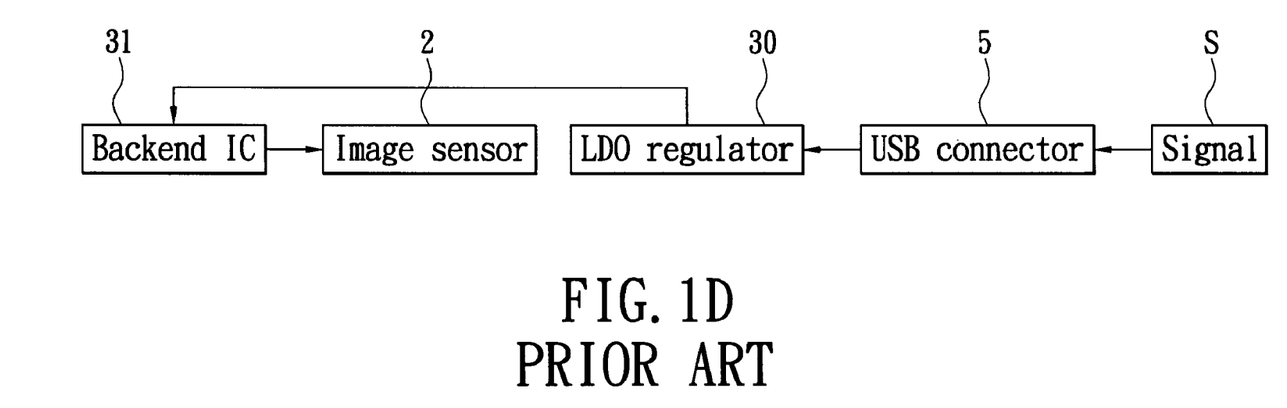
FIG. 1D is a function block of the image-sensing module of the prior art.

Moreover, referring to FIG. 1D, the electronic elements 3 at least include: an LDO (Low Dropout) regulator 30 and a backend IC 31. The LDO regulator 30 is disposed between the USB connector 5 and the image sensor 2 and is electrically connected to the USB connector 5. The backend IC 31 is far away from the LDO regulator 30 and is electrically connected to one side of the image sensor 2. Hence, the signals S from the USB connector 5 are transmitted to the LDO regulator 30, the backend IC 31, and the image sensor 2 in sequence. Therefore, the transmission path of the signals S can be improved from the USB connector 5 to the image sensor 2.

Hence, the image-sensing module of the prior art has the following defects:

1. Because the thickness of the hard substrate 1 is large, the thickness of the image-sensing module cannot be reduced.

2. Because all of the electronic elements 3 are electrically disposed on the hard substrate 1 with limited space, the size of the image-sensing module cannot be reduced.

3. The image-sensing module needs to use the anti-EMI element 4 to prevent the electronic elements 3 from being affected by electromagnetic interference, so the thickness of the image-sensing module cannot be reduced.

Hence, it is very important for designer to design a CMOS image-sensing chip package module of reduced thickness in order to integrate it into a portable electronic device of small thickness according to different market requirements.

SUMMARY OF THE INVENTION

One particular aspect of the present invention is to provide an image-sensing module for reducing its overall thickness and preventing electromagnetic interference. The image-sensing module uses a flexible substrate with at least one first opening to enclose a plurality of electronic elements that are electrically disposed on the flexible substrate so as to avoid electromagnetic interference. The image-sensing module has an image sensor passing through the first opening, so the image sensor is exposed by the first opening so as to reduce the thickness of the image-sensing module. Hence, the present invention can achieve the objects of reducing the overall thickness of the image-sensing module and preventing electromagnetic interference from affecting the image-sensing module.

In order to achieve the above-mentioned aspects, the present invention provides an image-sensing module for reducing its whole thickness and preventing electromagnetic interference, includes: a flexible substrate, an image sensor, and a plurality of electronic elements. The flexible substrate has a first PCB (Printed Circuit Board), a flexible bending board bent upwards from one side of the first PCB, and a second PCB extending forwards from the flexible bending board and disposed above the first PCB. The second PCB has at least one first opening. The image sensor is electrically disposed on the first PCB, and the image sensor is exposed by the first opening of the second PCB. The electronic elements are selectively electrically disposed on the first PCB and/or on the second PCB so that the electronic elements are disposed between the first PCB and the second PCB.

Hence, the image-sensing module of the present invention has the following advantages:

1. The flexible substrate 1a can have the following aspects: (1) both the first PCB and the second PCB are flexible PCBs, so that the flexible substrate has a flexible function; or (2) both the first PCB and the second PCB are inflexible PCBs, so that only one part of the flexible substrate 1a may have a flexible function, according to different design requirements.

2. When the second PCB is moved to a position above the first PCB by bending the flexible bending board, all of the electronic elements are hidden by the first PCB and the second PCB and only the image sensor is exposed by the first opening of the second PCB. Hence, the thickness of the image-sensing module of the present invention can be reduced.

3. The first PCB and the second PCB corresponds with each other to form two metal shields in order to prevent the electronic elements from being interfered by external electromagnetism.

4. The image-sensing module further includes at least one insulative adhesive layer disposed between two of the electronic elements, and the second PCB is positioned above the first PCB via the insulative adhesive layer. In addition, the insulative adhesive layer can be fully filled between the first PCB and the second PCB in order to: (1) firmly position the second PCB above the first PCB via the insulative adhesive layer; and (2) prevent the electromagnetism generated by the electronic elements on the first PCB from being affected by the electromagnetism of the electronic elements on the second PCB.

5. The image-sensing module further includes an input/output interface electrically connected to the LDO regulator, and the input/output interface can be a USB connector. Both the input/output interface and the LDO regulator are electrically disposed on the first PCB, and the backend IC is electrically disposed on the second PCB. Hence, the signals from the input/output interface are transmitted to the LDO regulator, the backend IC, and the image sensor in sequence by being transmitted through the conductive traces. Therefore, the transmission path of the signals is reduced from the input/output interface to the image sensor.

6. Because the electronic elements are evenly disposed on the first PCB and the second PCB, both the length of the first PCB and the length of the second PCB can be reduced.

It is to be understood that both the foregoing general description and the following detailed description are exemplary, and are intended to provide further explanation of the present invention as claimed. Other advantages and features of the present invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF PREFERRED EMBODIMENTS

Referring to FIGS. 2A to 2E, the first embodiment of the present invention provides an image-sensing module for reducing its overall thickness and preventing electromagnetic interference, including: a flexible substrate 1a, an image sensor 2a, and a plurality of electronic elements 3a.

Figure 2A:
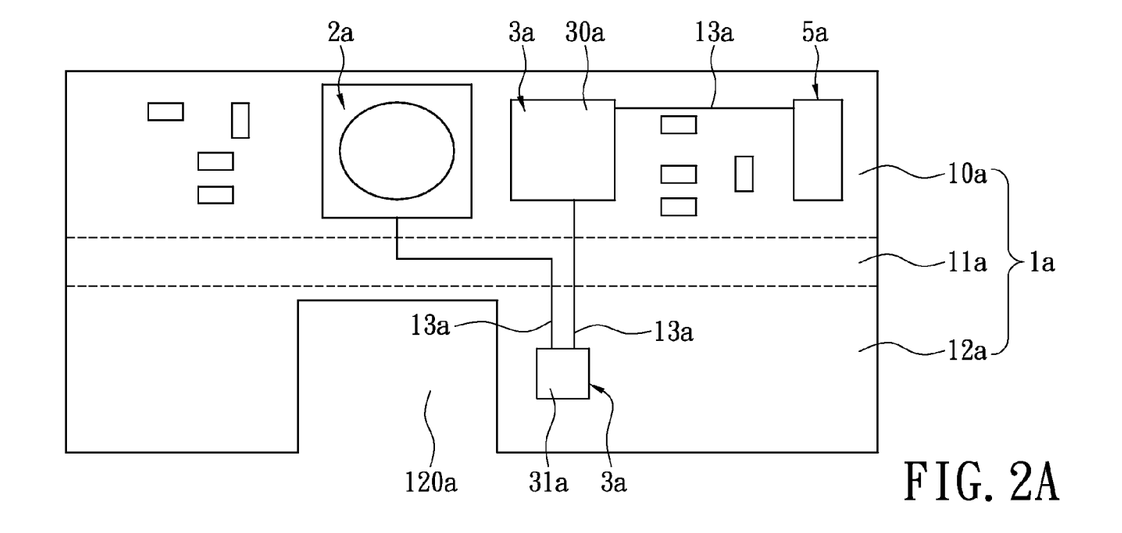
FIG. 2A is a top, schematic view of an image-sensing module according to the first embodiment of the present invention (before bending the flexible substrate)

The flexible substrate 1a has a first PCB (Printed Circuit Board) 10a, a flexible bending board 11a bent upwards from one side of the first PCB 10a, and a second PCB 12a extending forwards from the flexible bending board 11a and disposed above the first PCB 10a. The first PCB 10a, the flexible bending board 11a, and the second PCB 12a are integrated together. The second PCB 12a has at least one first opening 120a. In the first embodiment, the first opening 120a of the second PCB 12a is an open type first opening, and the open type first opening has a U shape (see FIG. 2D). In addition, the flexible substrate 1a has a plurality of conductive traces 13a (one part of the conductive traces 13a is shown in Figures) printed on the first PCB 10a, the flexible bending board 11a, and the second PCB 12a.

Furthermore, according to different design requirements, the flexible substrate 1a can have the following aspects: (1) both the first PCB 10a and the second PCB 12a are flexible PCBs, so that the flexible substrate 1a has a flexible function; or (2) both the first PCB 10a and the second PCB 12a are inflexible PCBs, so that one part of the flexible substrate 1a has a flexible function.

Figure 2B:
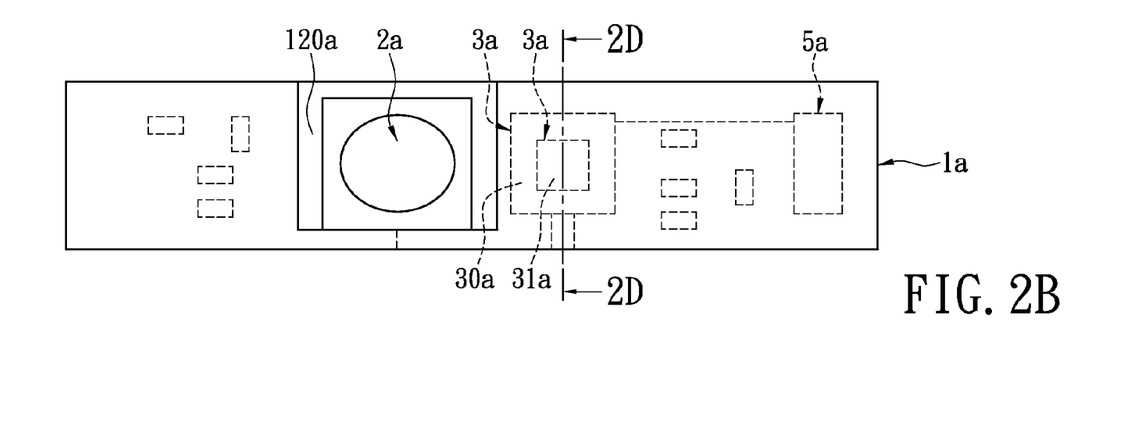
FIG. 2B is a top, schematic view of the image-sensing module according to the first embodiment of the present invention (after bending the flexible substrate)

Moreover, the image sensor 2a is electrically disposed on the first PCB 10a, and the image sensor 2a is exposed by the first opening 120a of the second PCB 12a. In other words, when the second PCB 12a is moved to a position above the first PCB 10a by bending the flexible bending board 11a (as shown in FIGS. 2A and 2B), all of the electronic elements 3a are hidden by the first PCB 10a and the second PCB 12a and only the image sensor 2a is exposed by the first opening 120a of the second PCB 12a. Hence, the thickness of the image-sensing module of the present invention can be reduced.

Figure 2C:
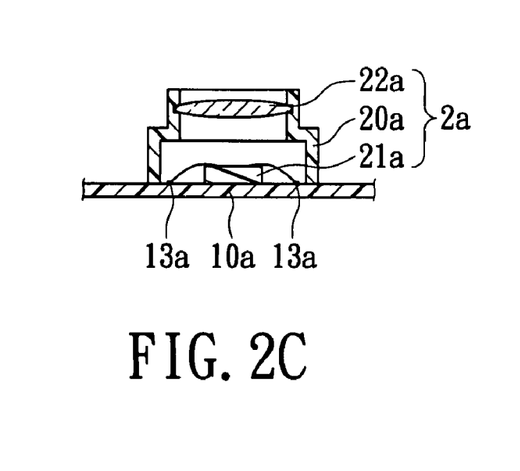
FIG. 2C is a lateral, cross-sectional view of the image sensor according to the first embodiment of the present invention.

Referring to FIG. 2C, in the first embodiment, the image sensor 2a can be a CMOS (Complementary Metal-Oxide-Semiconductor). The image sensor 2a has a body 20a, an image-sensing chip 21a received in the body 20a and electrically disposed on the first PCB 10a, and at least one lens 22a positioned in the body 20a and disposed above the image-sensing chip 21a. The image-sensing chip 21a is electrically connected to the conductive traces 13a that are formed on the first PCB 10a by a wire-bonding process.

In addition, the electronic elements 3a are selectively electrically disposed on the first PCB 10a and/or on the second PCB 12a so that the electronic elements 3a are disposed between the first PCB 10a and the second PCB 12a. The first PCB 10a and the second PCB 12a corresponds with each other to form two metal shields so as to prevent the electronic elements 3a from being interfered by external electromagnetism.

Figure 2D:
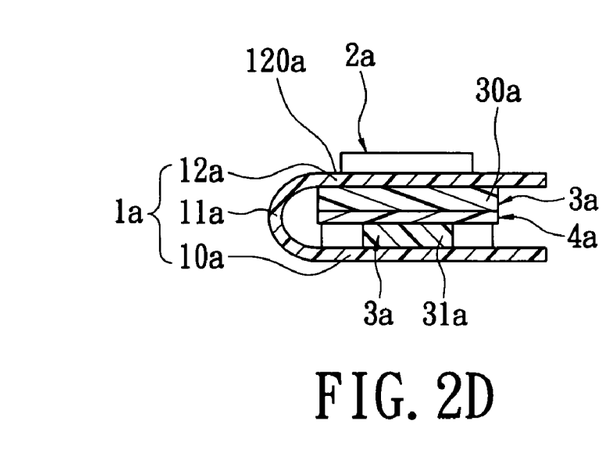
FIG. 2D is a cross-sectional, schematic view along line 2D-2D of the image-sensing module shown in FIG. 2B.

Referring to FIG. 2D, the image-sensing module further includes at least one insulative adhesive layer 4a disposed between two of the electronic elements 3a, and the two electronic elements 3a are respectively electrically disposed on the first PCB 10a and the second PCB 12a, so that the second PCB 12a is positioned above the first PCB 10a via the insulative adhesive layer 4a. In addition, the insulative adhesive layer 4a can be fully filled between the first PCB 10a and the second PCB 12a so as to: (1) firmly position the second PCB 12a above the first PCB 10a via the insulative adhesive layer 4a; and (2) prevent the electromagnetism generated by the electronic elements 3a on the first PCB 10a from being affected by the electromagnetism of the electronic elements 3a on the second PCB 12a.

Figure 2E:
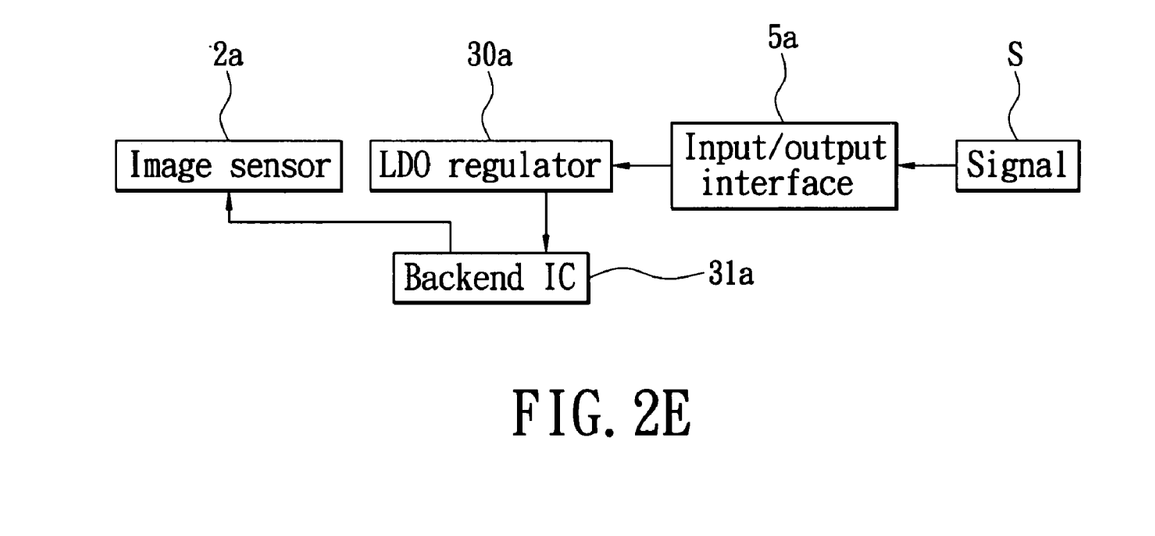
FIG. 2E is a function block of the image-sensing module according to the first embodiment of the present invention.

Referring to FIG. 2E, in the first embodiment, the electronic elements 3a at least includes an LDO (Low Dropout) regulator 30a and a backend IC (integrated Circuit) 31a electrically disposed between the LDO regulator 30a and the image sensor 2a. In addition, the image-sensing module further includes an input/output interface 5a electrically connected to the LDO regulator 30a, and the input/output interface 5a can be a USB connector. Both the input/output interface 5a and the LDO regulator 30a are electrically disposed on the first PCB 10a, and the backend IC 31a is electrically disposed on the second PCB 12a. Hence, the signals S from the input/output interface 5a are transmitted to the LDO regulator 30a, the backend IC 31a and the image sensor 2a in sequence by transmitting through the conductive traces 13a. Therefore, the transmission path of the signals S is reduced from the input/output interface 5a to the image sensor 2a.

Figure 3A:
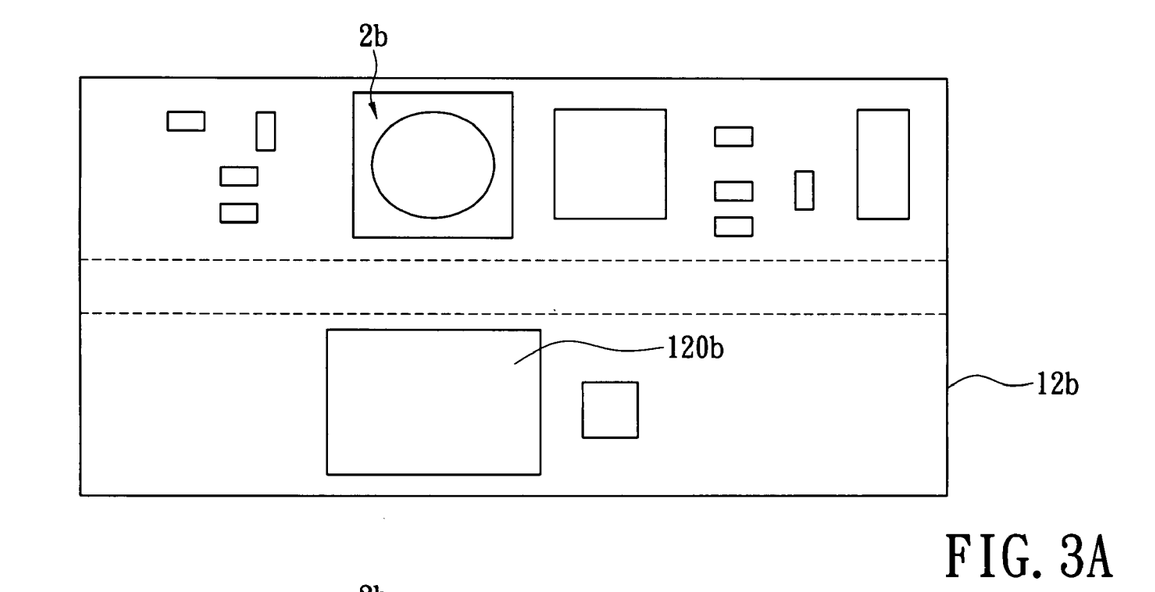
FIG. 3A is a top, schematic view of an image-sensing module according to the second embodiment of the present invention (before bending the flexible substrate)
Figure 3B:
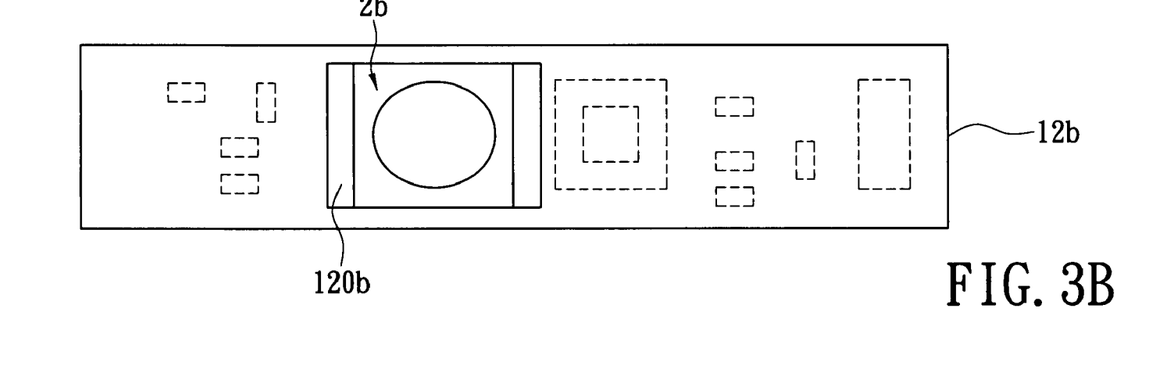
FIG. 3B is a top, schematic view of the image-sensing module according to the second embodiment of the present invention (after bending the flexible substrate)

Referring to FIGS. 3A and 3B, the difference between the second embodiment and the first embodiment is that: in the second embodiment, the first opening 120b of the second PCB 12b is an enclosed type first opening, and the enclosed type first opening has a square shape. Therefore, the image sensor 2b passes through the first opening 120b of the second PCB 12b, so that the image sensor 2b is exposed by the first opening 120b of the second PCB 12b.

Figure 4A:
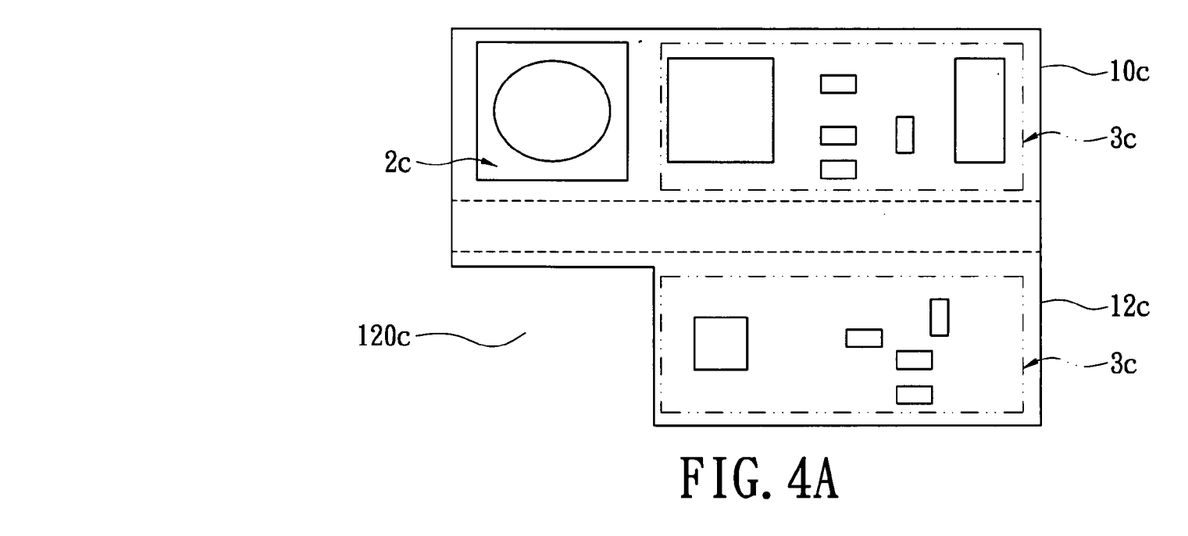
FIG. 4A is a top, schematic view of an image-sensing module according to the third embodiment of the present invention (before bending the flexible substrate)
Figure 4B:
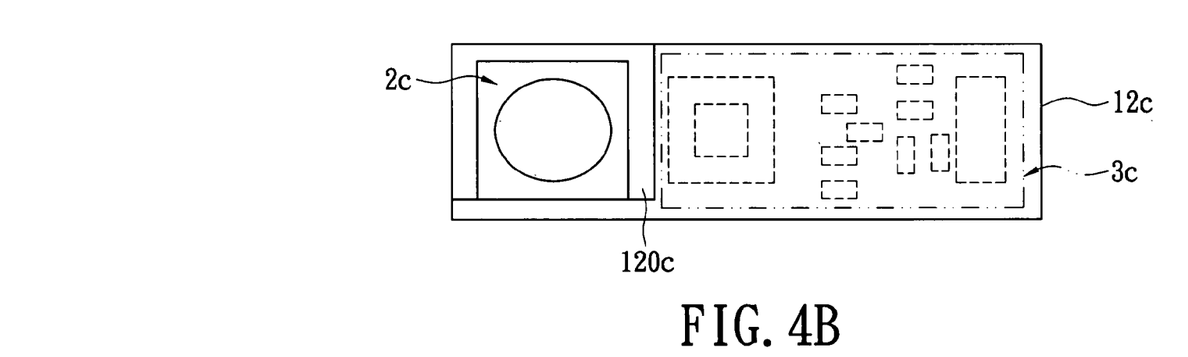
FIG. 4B is a top, schematic view of the image-sensing module according to the third embodiment of the present invention (after bending the flexible substrate)

Referring to FIGS. 4A and 4B, the difference between the third embodiment and the first embodiment is that: in the third embodiment, the first opening 120c of the second PCB 12c is an open type first opening, and the open type first opening has an L shape. Therefore, the image sensor 2c passes through the first opening 120c of the second PCB 12c, so that the image sensor 2c is exposed by the first opening 120c of the second PCB 12c. Because the electronic elements 3c are evenly disposed on the first PCB 10c and the second PCB 12c, both the length of the first PCB 10c and the length of the second PCB 12c can be reduced.

Figure 5A:
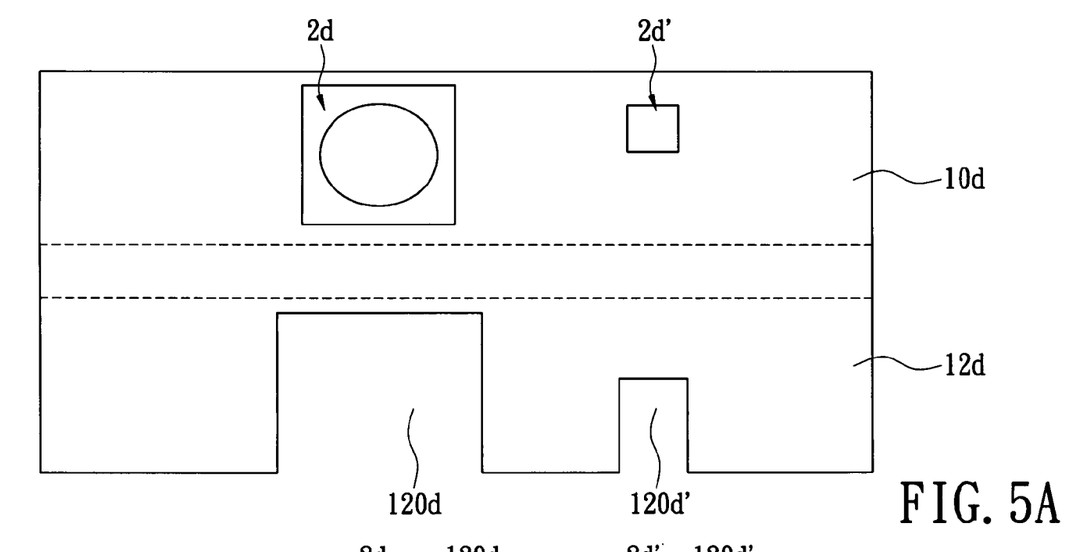
FIG. 5A is a top, schematic view of an image-sensing module according to the fourth embodiment of the present invention (before bending the flexible substrate)
Figure 5B:
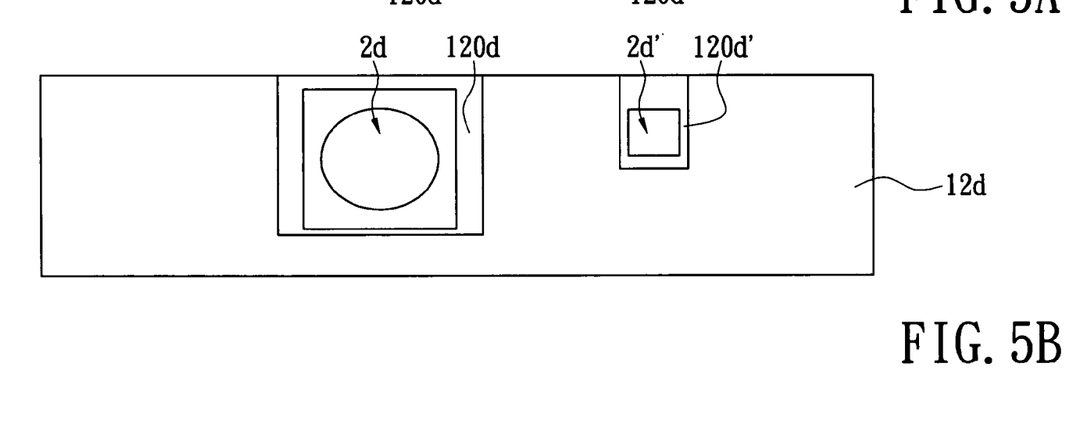
FIG. 5B is a top, schematic view of the image-sensing module according to the fourth embodiment of the present invention (after bending the flexible substrate).

Referring to FIGS. 5A and 5B, the fourth embodiment of the present invention includes at least one image sensor 2d and at least one light-emitting element 2d'. Both the image sensor 2d and the light-emitting element 2d' are electrically disposed on the first PCB 10d. The second PCB 12d has at least one first opening 120d and at least one second opening 120d'. Hence, the image sensor 2d is exposed by the first opening 120d of the second PCB 12d, and the light-emitting element 2d' is exposed by the second opening 120d' of the second PCB 12d. In addition, the first opening 120d and the second opening 120d' of the second PCB 12d can be opened type openings, and each opened type opening has an L shape or a square shape.

In conclusion, the image-sensing module uses the flexible substrate with at least one first opening to enclose the plurality of electronic elements that are electrically disposed on the flexible substrate so as to avoid electromagnetic interference. The image-sensing module has an image sensor passing through the first opening, so the image sensor is exposed by the first opening so as to reduce the thickness of the image-sensing module. Hence, the present invention can achieve the objects of reducing the overall thickness of the image-sensing module and preventing electromagnetic interference from affect the image-sensing module.

Although the present invention has been described with reference to the preferred best molds thereof, it will be understood that the present invention is not limited to the details thereof. Various substitutions and modifications have been suggested in the foregoing description, and others will occur to those of ordinary skill in the art. Therefore, all such substitutions and modifications are intended to be embraced within the scope of the present invention as defined in the appended claims.

What is claimed is:

1. An image-sensing module for reducing its overall thickness and preventing electromagnetic interference (EMI), comprising:
    a flexible substrate having a first PCB (Printed Circuit Board), a flexible bending board bent upwards from one side of the first PCB, and a second PCB extending forwards from the flexible bending board and disposed above the first PCB, wherein the second PCB has at least one first opening;
    an image sensor electrically disposed on the first PCB, wherein the image sensor is exposed by the first opening of the second PCB;
    a plurality of electronic elements selectively electrically disposed on the first PCB and/or on the second PCB so that the electronic elements are disposed between the first PCB and the second PCB; and at least one insulative adhesive layer disposed between two of the electronic elements, and the two electronic elements are respectively electrically disposed on the first PCB and the second PCB, so that the second PCB is positioned above the first PCB via the insulative adhesive layer.

2. The image-sensing module as claimed in claim 1, wherein both the first PCB and the second PCB are flexible PCBs.

3. The image-sensing module as claimed in claim 1, wherein both the first PCB and the second PCB are inflexible PCBs.

4. The image-sensing module as claimed in claim 1, wherein the first opening of the second PCB is an enclosed type first opening, and the enclosed type first opening has a square shape.

5. The image-sensing module as claimed in claim 1, wherein the first opening of the second PCB is an open type first opening.

6. The image-sensing module as claimed in claim 5, wherein the open type first opening has a U shape.

7. The image-sensing module as claimed in claim 5, wherein the open type first opening has an L shape.

8. The image-sensing module as claimed in claim 1, wherein the flexible substrate has a plurality of conductive traces printed on the first PCB, the flexible bending board, and the second PCB.

9. The image-sensing module as claimed in claim 1, wherein the image sensor has a body, an image-sensing chip received in the body and electrically disposed on the first PCB, and at least one lens positioned in the body and disposed above the image-sensing chip.

10. The image-sensing module as claimed in claim 1, wherein the image sensor is a CMOS (Complementary Metal-Oxide-Semiconductor).

11. An image-sensing module for reducing its overall thickness and preventing electromagnetic interference (EMI), comprising:
    a flexible substrate having a first PCB (Printed Circuit Board), a flexible bending board bent upwards from one side of the first PCB, and a second PCB extending forwards from the flexible bending board and disposed above the first PCB, wherein the second PCB has at least one first opening;
    an image sensor electrically disposed on the first PCB, wherein the image sensor is exposed by the first opening of the second PCB;
    a plurality of electronic elements selectively electrically disposed on the first PCB and/or on the second PCB so that the electronic elements are disposed between the first PCB and the second PCB, wherein the electronic elements at least includes an LDO (Low Dropout) regulator and a backend IC (integrated Circuit) electrically disposed between the LDO regulator and the image sensor.

12. The image-sensing module as claimed in claim 11, further comprising: an input/output interface electrically connected to the LDO regulator, wherein both the input/output interface and the LDO regulator are electrically disposed on the first PCB, and the backend IC is electrically disposed on the second PCB.

13. The image-sensing module as claimed in claim 11, wherein the first PCB, the flexible bending board, and the second PCB are integrated together.

14. The image-sensing module as claimed in claim 12, further comprising: at least one light-emitting element electrically disposed on the first PCB.

15. An image-sensing module for reducing its overall thickness and preventing electromagnetic interference (EMI), comprising:
   a flexible substrate having a first PCB (Printed Circuit Board), a flexible bending board bent upwards from one side of the first PCB, and a second PCB extending forwards from the flexible bending board and disposed above the first PCB, wherein the second PCB has at least one first opening;
   an image sensor electrically disposed on the first PCB, wherein the image sensor is exposed by the first opening of the second PCB; and
   a plurality of electronic elements selectively electrically disposed on the first PCB and/or on the second PCB so that the electronic elements are disposed between the first PCB and the second PCB; and
   at least one light-emitting element electrically disposed on the first PCB, wherein the second PCB has at least one second opening, and the light-emitting element is exposed by the second opening of the second PCB.

* * * * *